United States Patent [19]

Nomura

[11] Patent Number: 5,256,965
[45] Date of Patent: Oct. 26, 1993

[54] QUALITY INSPECTING METHOD AND APPARATUS FOR DETECTING DEFECTS IN MAGNETIC DISKS BY DIVIDING A PLURALITY OF CONCENTRIC TRACKS INTO NUMBERED SECTORS

[75] Inventor: Shinichi Nomura, Narashino, Japan

[73] Assignee: Seiko Seiki Kabushiki Kaisha, Japan

[21] Appl. No.: 731,744

[22] Filed: Jul. 16, 1991

[30] Foreign Application Priority Data

Jul. 30, 1990 [JP] Japan ................... 2-80942[U]

[51] Int. Cl.⁵ .................... G01R 33/12; G01N 27/82
[52] U.S. Cl. ........................ 324/212; 369/58
[58] Field of Search ............. 324/210, 212; 360/25, 360/31; 369/53, 58

[56] References Cited

U.S. PATENT DOCUMENTS 3,686,682 8/1972 Behr et al. .................. 324/212 X

FOREIGN PATENT DOCUMENTS 0108771 6/1985 Japan .................. 324/210
0038476 2/1986 Japan .................. 324/212

*Primary Examiner*—Gerard R. Strecker
*Attorney, Agent, or Firm*—Bruce L. Adams; Van C. Wilks

[57] ABSTRACT

A magnetic disk inspection apparatus for recording and reproducing inspection signals onto and from each track on a magnetic disk, in which the inspection signals are recorded and reproduced automatically without a manual operation onto and from the magnetic disk, the maximum value is detected from the reproduction signals on the basis of the sampling signal, the average value of the maximum values is calculated for each sector, the difference between the average values in the same sector number of the adjacent tracks is determined, the change ratio based on this difference is calculated and quality of the magnetic disk is judged on the basis of this change ratio.

9 Claims, 5 Drawing Sheets

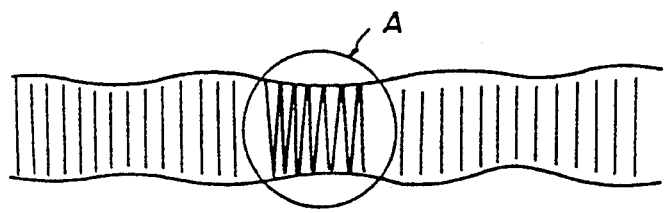
FIG. 5(a)
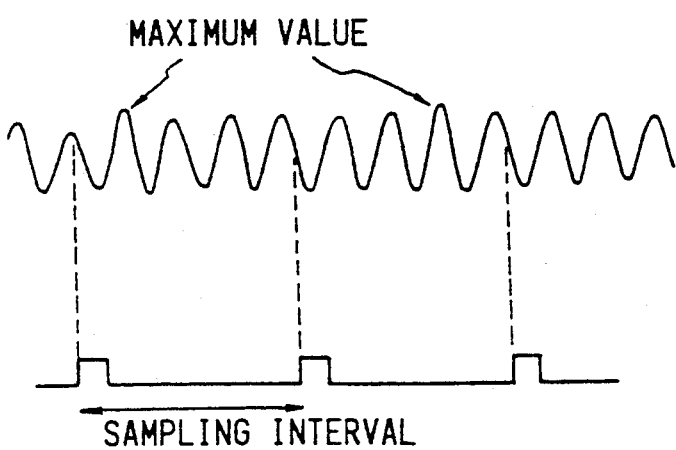
FIG. 5(b)
FIG. 5(c)
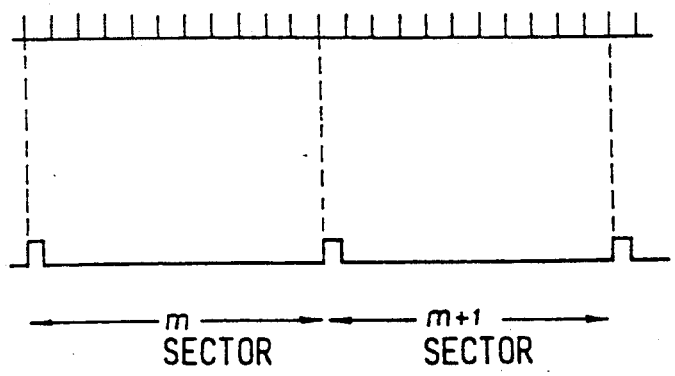
FIG. 5(d)
FIG. 5(e)

QUALITY INSPECTING METHOD AND APPARATUS FOR DETECTING DEFECTS IN MAGNETIC DISKS BY DIVIDING A PLURALITY OF CONCENTRIC TRACKS INTO NUMBERED SECTORS

BACKGROUND OF THE INVENTION

The present invention relates to a magnetic disk inspection apparatus and more particularly, to a magnetic disk inspection apparatus which records and reproduces an inspection signal onto and from each track on a magnetic disk and inspects quality of the magnetic disk on the basis of the reproduction signal.

In magnetic disks in general (hereinafter referred to as a "disk(s)", inspection whether or not a recorded signal can be reproduced correctly is conducted and an inspection method referred to as "radial modulation measurement" is included among the inspection methods.

This inspection is made particularly for evaluating whether or not the disk can be used as a servo disk. An inspection signal is recorded in place of a servo signal onto a blank disk onto which no recording is made, this inspection signal is then reproduced and the reproduction signal is inputted to an oscilloscope.

Next, an inspector has the reproduction waveform of the reproduction signal displayed on the oscilloscope and determines the peak values of a plurality of reproduction signals for each track.

The inspector inputs the peak value to processing unit such as a personal computer so as to calculate an average value for each sector of each track. In the case of this inspection, the difference between the average values in the same sector of adjacent tracks is determined. Suitable processing is conducted on this difference and the result of the processing is compared with predetermined allowable value so as to judge quality of the disk.

In accordance with the conventional inspection method described above, however, the inspector must carry out a series of manual operations of inputting the reproduction signals to the oscilloscope, observing the reproduction waveforms to detect the peak values, etc, and inputting the peak values, etc, to the personal computer or the like for processing. Accordingly, there arise problems that an extremely long time is necessary for the inspection and the inspection itself is troublesome.

SUMMARY OF THE INVENTION

It is an object of the present invention to provide a magnetic disk inspection apparatus which can inspect quality of magnetic disks automatically.

It is another object of the present invention to provide a magnetic disk inspection apparatus for inspecting radial modulation of magnetic disks automatically.

In order to accomplish the object described above, the present invention provides a magnetic disk inspection apparatus for recording and reproducing inspection signals onto and from each track on a magnetic disk fitted to a spindle and inspecting quality of the magnetic disk on the basis of the reproduced inspection signals which apparatus comprises sampling signal generation means for generating a sampling signal in accordance with the rotation of the spindle; maximum value detection means for detecting a maximum value from the inspection signals reproduced from the magnetic disk in synchronism with the sampling signal; average value calculation means for calculating the average value of the maximum values detected by the maximum value detection means for each sector on the track; change ratio calculation means for determining the difference between the average values in the same sector number of adjacent tracks and calculating a change ratio based on this difference; and quality judgement means for judging quality of the magnetic disk on the basis of the change ratio.

According to the construction described above, inspection signals are recorded onto each track on a magnetic disk by means such as a magnetic head and the inspection signals are then reproduced. In this instance, maximum value detection means detects the maximum value of the inspection signals from among the reproduction signals in synchronism with the sampling signal generated by sampling signal generation means, and average value calculation means calculates an average value of the maximum values for each sector on each track.

Next, change ratio calculation means determines the difference between the average values in the same sector number of adjacent tracks from the average values determined by the average value calculation means and calculates a change ratio based on this difference. A method of calculating the change ratio includes a method which divides the difference obtained by the method described above by the sum of the average values in the same sector of adjacent tracks and other methods can of course be employed.

Finally, quality judgement means judges quality of the magnetic disk on the basis of the change ratio calculated by the change ratio calculation means described above. For example, if the change ratio exceeds a predetermined allowable value, the disk is judged to be "rejectable (disapproved)" and if it is within the allowable value, the disk is judged to be "acceptable (approved)".

BRIEF DESCRIPTION OF THE DRAWINGS

FIGS. 5(a) -(e) are waveform diagrams showing the waveform of the each signal in the embodiment of the present invention.

DETAILED DESCRIPTION OF THE PREFERRED EMBODIMENT

Hereinafter, an embodiment of the magnetic disk inspection apparatus in accordance with the present invention will be explained with reference to the accompanying drawings.

Figure 1:
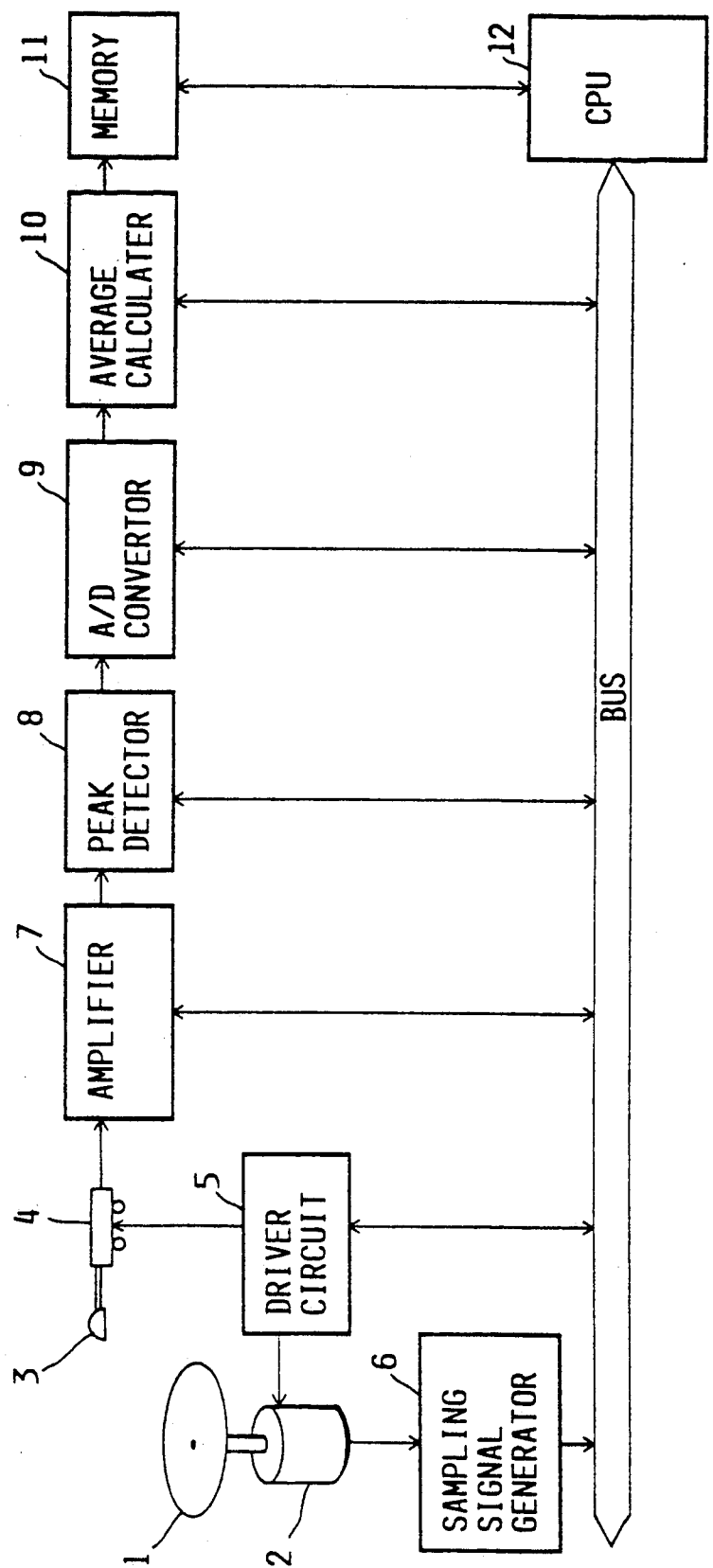
FIG. 1 is a block diagram showing an embodiment of a magnetic disk inspection apparatus in accordance with the present invention.

FIG. 1 is a block diagram showing the configuration of the magnetic disk inspection apparatus of this embodiment.

In the drawing, no data, no signal, etc is recorded onto a disk as an object of inspection and this disk 1 is fitted to a spindle 2 of the present apparatus at the time of inspection and is rotated.

The apparatus of the present invention is provided with a magnetic head 3 for recording and reproducing an inspection signal onto and from the disk 1 described above, a carriage 4 for supporting the magnetic head 3, a driver circuit 5 for moving and rotating both of the carriage 4 and the spindle 2 described above, and a sampling signal generation circuit 6 for generating sampling signals with a predetermined period in accordance with the rotation of the spindle 2.

Furthermore, the present apparatus includes an amplifier 7 for amplifying a reproduction signal outputted from the magnetic head 3, a peak detector 8 for detecting a maximum value of reproduction signals obtained through the amplifier 7 in synchronism with a sampling signal outputted from the sampling signal generator 6, an A/D convertor 9 for converting the maximum value outputted from the peak detector 8 to a digital value, an average calculater 10 for adding and holding temporarily the maximum value to and in a register or the like, and calculating an average value by dividing the sum of the maximum values added to and held by the register by the number of samplings for each sector in synchronism with a sector signal having a period equivalent to the periods of several sampling signals for each track, a memory 11 for storing sequentially the average value described above and a later-appearing change ratio, and a central processing unit 12 (hereinafter referred to as "CPU") for sending an instruction to each circuit through a bus 13, controlling the operation of each circuit, calculating the average value described above in a later-appearing method and making judgement on the basis of the result of the calculation. Incidentally, the register of the average calculater 10 is constructed in such a fashion that it is reset after the average value of the current sector has been stored in the memory 11 and the average value of the next sector is determined so that the average value of the latest sector can be obtained.

The alternative sequence can be realized by the configuration to store directly value outputted from the A/D convertor 9 in the memory 11 instead of the register of the average calculater 10 and to determine an average value by the CPU 12.

Figure 2:
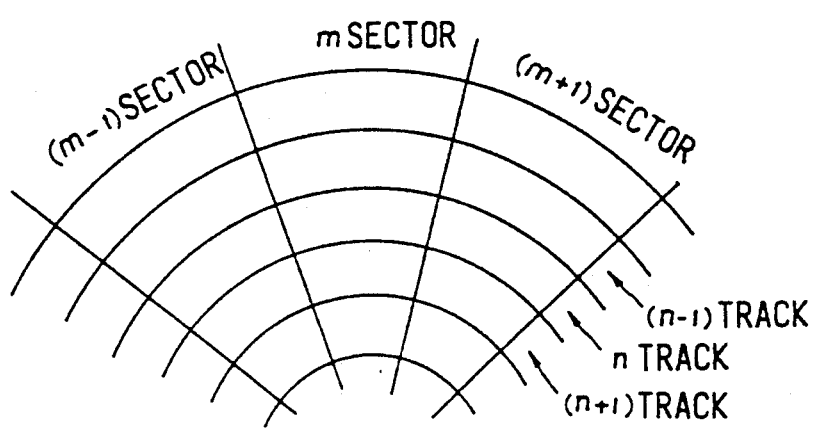
FIG. 2 is a plan view showing a track and a sector on a disk.

In the same sector number m of adjacent tracks n and n+1 as shown in FIG. 2, for example, the CPU 12 has the functions of determining the difference and sum of the average values $V(n, m)$, $V(n+1, m)$ of the maximum values of the reproduction signals in that sector m and then dividing the difference by the sum as expressed by the following formula:

$$\frac{V(n, m) - V(n + 1, m)}{V(n, m) + V(n + 1, m)}$$

or in other words, the function as change ratio calculation means for calculating the change ratio between the adjacent tracks, and the function of quality judgement means for comparing the change ratio with a predetermined allowable value and judging quality of the magnetic disk according to whether or not a predetermined proportion or a predetermined number of change ratios exceeding the allowable value exist. In order to let the CPU 12 function as the change ratio calculation means and the quality judgement means, a microprogram to exhibit the function described above is stored in a programmable ROM, or the like, that is not shown in the drawing.

Figure 3:
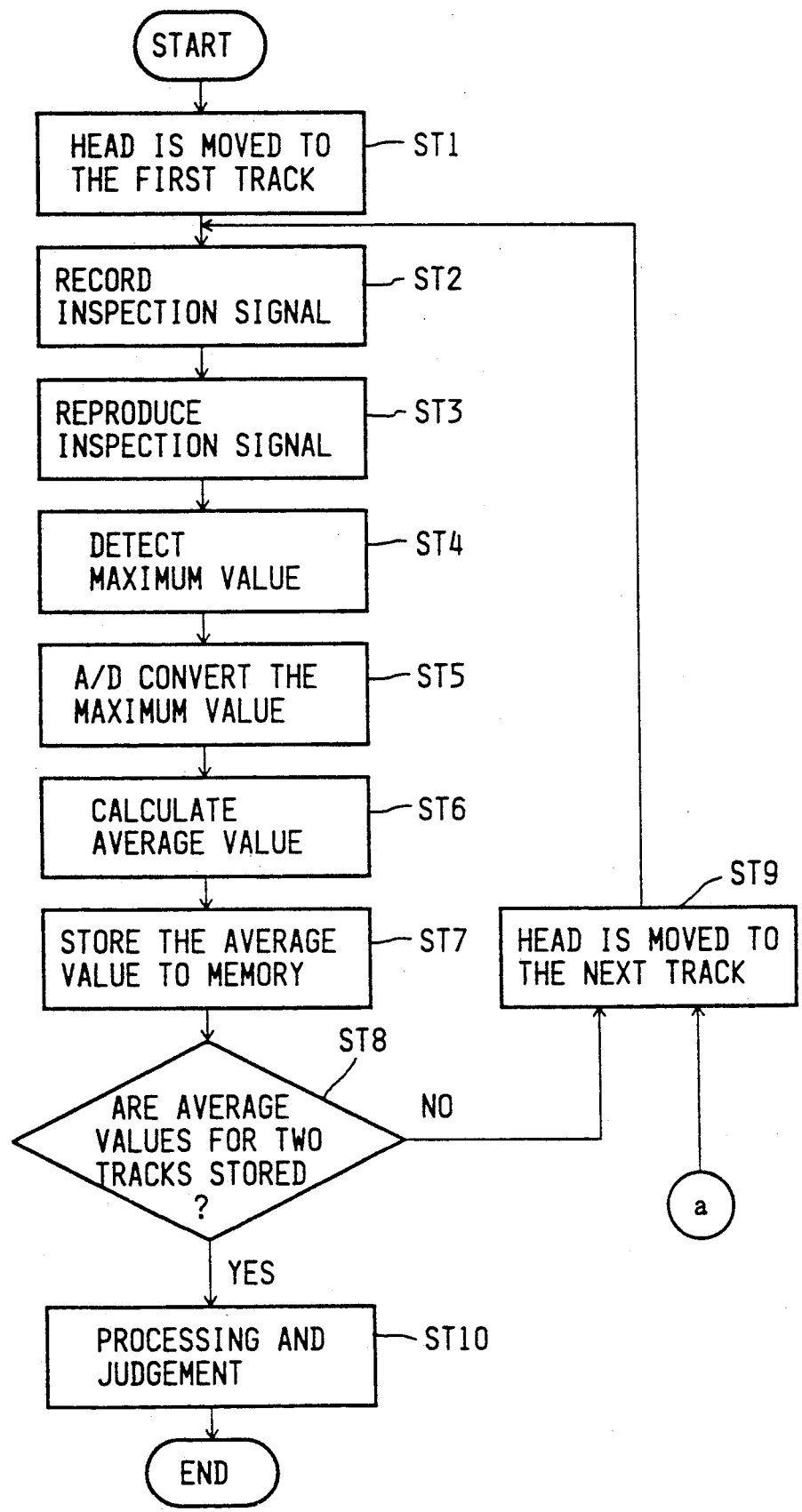
FIG. 3 is a flowchart showing the operation of the embodiment of the present invention.
Figure 4:
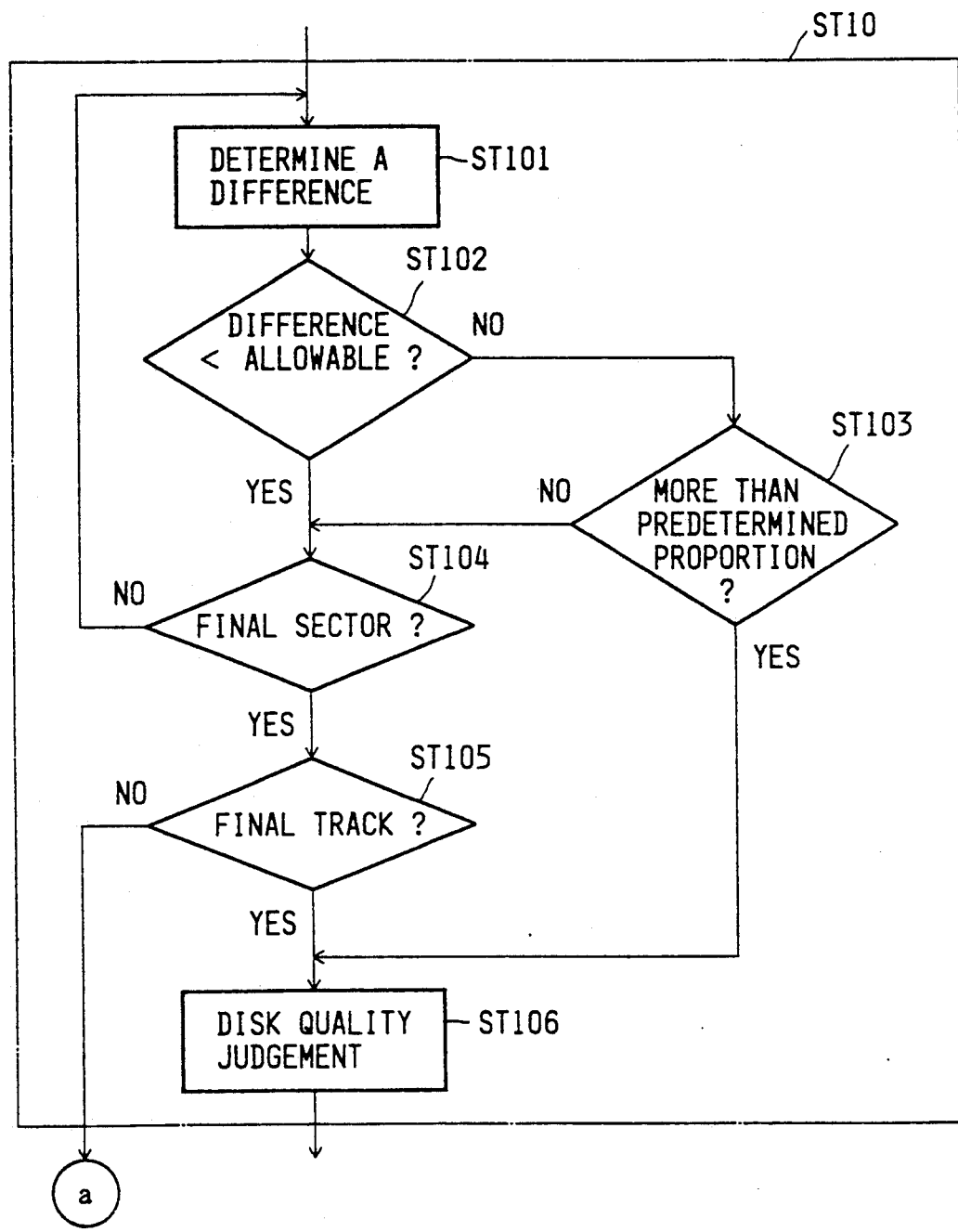
FIG. 4 is a flowchart showing the detailed operation of ST10 in FIG. 3.

Next, the function of the present apparatus will be explained with reference to FIG. 3 showing the operations of the present apparatus, FIG. 4 showing the processing inside the CPU and FIG. 5 showing the waveforms of various signals.

To begin with, when the disk 1 is fitted to the spindle 2 of the present apparatus, an inspection start instruction is outputted from the CPU 12 to each circuit through the bus 13.

On receiving the inspection start instruction, the driver circuit 5 rotates the spindle 2 and when the spindle attains a predetermined rotation speed, the driver circuit 5 drives the carriage 4 so that the magnetic head 3 is moved to a first track (ST1 in FIG. 3) and inspection signals are recorded on a full circumference of the track through the magnetic head 3 by a record/reproduction circuit not shown in the drawing (ST2 in FIG. 3).

Next, readout instruction of the inspection signals is outputted from the CPU 12 and the inspection signals recorded onto the magnetic disk 1 are reproduced (ST3 in FIG. 3). Incidentally, the reproduced inspection signals have an envelop such as shown in FIG. 5(a) and when the waveform of its portion A is enlarged, it can be understood that it is a waveform having variance of amplitude as shown in FIG. 5(b).

The reproduction signals are amplified by the amplifier 7 and are inputted to the peak detector 8. The peak detector 8 detects a maximum value (peak value) included in that portion of the waveform of the reproduction signals shown in FIG. 5(b) that spans a sampling interval shown in FIG. 5(c) (ST4 in FIG. 3).

This maximum value is inputted to the A/D convertor 9 and is digitized there (ST5 in FIG. 3).

The digitized maximum value is inputted to the average calculater 10, which adds and holds temporarily the maximum value in a register or the like, calculates an average value by dividing the sum of maximum values added and held in the register for each sector by the number of samplings in synchronism with a sector signal equivalent to several sampling signals and shown in FIG. 5(e) for the sampling signals shown in FIG. 5(d), and outputs its average value (ST6 in FIG. 3).

The average value outputted from the average calculater 10 is sent to, and stored in, the memory 11 through the bus 13 for each sector under the state where it is synchronized with a sector signal by the control of the CPU 12 (ST7 in FIG. 3).

After the processing described so far is completed for the first track, the CPU 12 detects a maximum value in synchronism with the sampling signal for the next track in the same way as described above, gives an instruction so as to calculate the average value of the maximum values for each sector and to store the average value in the memory 11 and executes sequentially the above-mentioned processing for each track (ST2-9 in FIG. 3).

Thereafter, the CPU 12 judges whether or not average values of a sector for two tracks are stored in the memory 11 (ST8 in FIG. 3) and if average values for the two tracks are not stored in the memory ("NO" at ST8 in FIG. 3), the CPU 12 gives an instruction to move to the next track and to execute a series of processings described above (ST9 in FIG. 3).

In contrast, if average values for the two tracks is stored in the memory 11 ("YES" at ST8 in FIG. 3), the CPU 12 executes calculation of a change ratio for the radial modulation measurement and the processing of quality judgement in parallel with the processing described above (ST10 in FIG. 3).

In other words, the CPU 12 reads out an average value for each sector that is stored in the memory 11, determines the difference and sum of average values in the same sector number of the adjacent tracks and calculates the change ratio between the adjacent tracks for each sector from these difference and sum in accordance with the afore-mentioned formula (ST101 in FIG. 4).

The CPU 12 stores a change ratio calculated for each sector in the memory 11, compares a change ratio as to whether or not it exceeds a predetermined allowable value for each sector (ST102 in FIG. 4) and stores also the result of comparison in the memory 11. For example, a change ratio is calculated and outputted as 0.5% for a first sector, 0.4% for a second sector, 0.3% for a third sector, and so forth between the adjacent tracks n and n+1, and these change ratios are compared with an allowable value which is set to 0.4%, for example.

If a change ratio exceeding the allowable value is found as a result of the comparison ("NO" at ST102 in FIG. 4), whether or not such change ratios exist in not less than a predetermined proportion or in a predetermined number and whether the inspection is to be continued or stopped is decided in accordance with the result (ST103 in FIG. 4).

In other words, if the change ratios exceeding the allowable value exists in not less than a predetermined proportion ("YES" at ST103 in FIG. 4), the magnetic disk is judged immediately to be "rejectable (disapproved)" (ST106 in FIG. 4) and the inspection is terminated. On the other hand, if the change ratio is smaller than the allowable value ("YES" at ST102 in FIG. 4) or if change ratio exceeding the allowable value does not constitute the predetermined proportion described above ("NO" at ST103 in FIG. 4), the procedures ranging from the calculation of a change ratio to the judgement are repeated sequentially for the next sector (ST101-ST104 in FIG. 4).

After the processings described above are completed for the final sector for each track ("YES" at ST104), whether or not the track is the final track is judged (ST105 in FIG. 4) and if the processing is not completed for the final track ("NO" at ST105 in FIG. 4), processing is moved to the next track (ST9 in FIG. 3) and the previous processing is repeated (ST2-ST9 in FIG. 3).

On the other hand, when the processing is completed for the final track ("YES" at ST105 in FIG. 4), quality of the disk is judged in accordance with the results of comparison that have so far been compared, stored in the memory and totaled (ST106 in FIG. 4). In this case, since a change ratio exceeding the allowable value does not exist in a proportion exceeding the predetermined proportion or in the number exceeding the predetermined number and since this inspection process is continued and completed for the final track the CPU 12 may judge this disk to be "good (approved)", but may also judge quality of the disk by processing the data of the change ratio stored in the memory 11 to prepare a histogram, displaying the histogram on a display device such as a CRT, not shown in the drawing, and judging the disk from its distribution.

Accordingly, since the inspection referred to as "radial modulation measurement" is effected automatically without a manual operation in accordance with the present apparatus, it is not necessary for the inspector to observe the waveform of the reproduction signal on the oscilloscope, to determine the peak value from the waveform and to make operation using a personal computer, or the like. Therefore, the inspection time can be shortened and the trouble of inspection can be eliminated.

If change ratios exceeding the allowable value exist in a proportion or number exceeding a predetermined proportion or number, the present apparatus judges the disk to be "rejectable (disapproved)" and terminates the inspection. Therefore, the inspection time can be further shortened.

Incidentally, in this embodiment, the CPU compares a change ratio with an allowable value and when the change ratios exceeding the allowable value exist in not less than the predetermined proportion or in the predetermined number, the inspection of this disk is stopped automatically. In the present invention, it is possible to set the predetermined proportion or the predetermined number to 0% or 0, to judge immediately the disk to be "rejectable (disapproved)" when a change ratio exceeding the allowable value described above exists, and to stop the inspection of the disk.

As described above, in the inspection in accordance with the present invention, the inspection signals are recorded and reproduced automatically without a manual operation onto and from the magnetic disk, the maximum value is detected from the reproduction signals on the basis of the sampling signal, the average value of the maximum value is calculated for each sector, the difference between the average values in the same sector of the adjacent tracks is determined, the change ratio based on this difference is calculated and quality of the magnetic disk is judged on the basis of this change ratio. Accordingly, it is not necessary for the inspector to observe the waveform of the reproduction signal on the oscilloscope, to determine the peak value from the waveform and to process the peak value by the personal computer, or the like. Therefore, the inspection time can be shortened and the trouble of the inspection can be eliminated.

What is claimed is:

1. A magnetic disk inspection apparatus for use with a magnetic disk defining a plurality of circular concentric tracks divided into angularly-spaced sectors for recording and reproducing inspection signals onto and from each sector of track when the magnetic disk is mounted on a spindle and for inspecting the magnetic disk for rejectable defect on the basis of the reproduced inspection signals, said apparatus comprising:

sampling signal generation means for generating a sampling signal having a frequency such that several sampling signals are generated within a predetermined sector interval in accordance with a rotation of said spindle;

maximum value detection means for detecting a maximum value from the inspection signals reproduced from said magnetic disk in synchronism with said sampling signal;

average calculation means for calculating the average value of maximum values detected in synchronism with said sampling signal by said maximum value detection means for each sector of track;

change ratio calculation means for determining a difference between said average values in the same sector number of adjacent tracks and calculating a change ratio based on this difference; and quality judgement means for judging quality of said magnetic disk on the basis of said change ratio.

2. The magnetic disk inspection apparatus in accordance with claim 1, wherein said quality judgement means judges radial modulation of said magnetic disk on the basis of said change ratio.

3. The magnetic disk inspection apparatus in accordance with claim 1, wherein said quality judgement means judges said magnetic disk to be rejectable when the change ratios exceeding an allowable value exist in a proportion and/or number exceeding a predetermined proportion and/or number.

4. The magnetic disk inspection apparatus in accordance with claim 1, wherein said change ratio calculation means includes means for calculating said change ratio by subtracting average values in the same sector number of adjacent tracks to determine a difference and then dividing the difference by the sum of said average values.

5. A method for inspecting the quality of a magnetic disk, comprising the steps of:
   addressing a magnetic disk by dividing tracks on the magnetic disk into numbered sectors;
   recording inspection signals on a track on the magnetic disk;
   reproducing the inspection signals from the track on the magnetic disk;
   generating a sampling signal in accordance with rotation of the magnetic disk;
   detecting maximum values from the inspection signals reproduced from a number sector of track in synchronism with the sampling signal;
   calculating an average value of the maximum values detected for the numbered sector in synchronism with the sampling signal;
   calculating a change ratio depending on a difference between the calculated average values in the same sector number of adjacent tracks; and
   judging the quality of the magnetic disk on the basis of the change ratio.

6. A method according to claim 5, further including judging radial modulation of the magnetic disk on the basis of the change ratio.

7. A method according to claim 5, wherein the judging step comprises
   comparing the change ratio to a first predetermined allowable value;
   comparing the change ratio to a second predetermined allowable value if the new value exceeds the first predetermined allowable value; and
   rejecting the magnetic disk if the change ratio exceeds the second predetermined allowable value.

8. A method according to claim 5, wherein the step of calculating the difference comprises
   subtracting the average values of the same sector number of adjacent tracks to determine a difference;
   summing the average values of the same sector number of adjacent tracks to determine a sum; and
   dividing said difference by said sum to obtain a change ratio indicative of the quality of the magnetic disk.

9. A method according to claim 5, wherein each sector of each track is addressed until a defect is detected and inspection is immediately concluded upon detection of a defect.

* * * * *